(12) United States Patent
Nakazawa et al.

(10) Patent No.: US 8,021,712 B2
(45) Date of Patent: Sep. 20, 2011

(54) WAFER AND MANUFACTURING METHOD OF ELECTRONIC COMPONENT

(75) Inventors: Osamu Nakazawa, Tokyo (JP); Nozomu Hachisuka, Tokyo (JP); Tetsuya Hiraki, Tokyo (JP)

(73) Assignee: TDK Corporation, Tokyo (JP)

( * ) Notice: Subject to any disclaimer, the term of this patent is extended or adjusted under 35 U.S.C. 154(b) by 108 days.

(21) Appl. No.: 12/406,445

(22) Filed: Mar. 18, 2009

(65) Prior Publication Data

US 2010/0237345 A1    Sep. 23, 2010

(51) Int. Cl.
*H05K 3/02* (2006.01)
*H05K 3/30* (2006.01)
*H01L 21/301* (2006.01)

(52) U.S. Cl. ........ 427/97.6; 427/130; 427/271; 427/331; 427/355; 428/800; 428/141; 438/3; 438/14; 438/18; 438/19; 438/460; 257/48; 257/421; 257/427; 257/618; 257/698

(58) Field of Classification Search .................. None
See application file for complete search history.

(56) References Cited

U.S. PATENT DOCUMENTS

| | | | |
|---|---|---|---|
| 4,855,253 A | 8/1989 | Weber | |
| 5,514,953 A * | 5/1996 | Schultz et al. ................ | 324/228 |
| 5,710,510 A | 1/1998 | Seagle et al. | |
| 6,379,998 B1 * | 4/2002 | Ohta et al. ..................... | 438/107 |
| 6,642,713 B2 | 11/2003 | Diederich | |
| 6,859,678 B1 * | 2/2005 | Barada et al. ................. | 700/121 |
| 7,220,990 B2 * | 5/2007 | Aghababazadeh et al. ..... | 257/48 |
| 7,256,055 B2 * | 8/2007 | Aghababazadeh et al. ..... | 438/11 |
| 7,313,014 B2 * | 12/2007 | Ooishi .......................... | 365/158 |
| 7,384,327 B2 * | 6/2008 | Mizoguchi et al. ............... | 451/8 |
| 7,417,442 B2 * | 8/2008 | Hachisuka et al. ........... | 324/691 |
| 7,423,288 B2 * | 9/2008 | Aghababazadeh et al. ..... | 257/48 |
| 7,605,597 B2 * | 10/2009 | Aghababazadeh et al. ........................ | 324/750.3 |
| 7,723,724 B2 * | 5/2010 | Aghababazadeh et al. ..... | 257/48 |
| 7,730,434 B2 * | 6/2010 | Aghababazadeh et al. ... | 716/136 |
| 7,736,916 B2 * | 6/2010 | Aghababazadeh et al. ..... | 438/11 |
| 7,847,288 B2 * | 12/2010 | Kwon .............................. | 257/48 |
| 7,863,911 B2 * | 1/2011 | Hong et al. .................... | 324/715 |
| 2003/0006795 A1 * | 1/2003 | Asayama et al. ............. | 324/763 |

FOREIGN PATENT DOCUMENTS

| | | |
|---|---|---|
| JP | 5-73849 | 3/1993 |
| JP | 6-333213 | 12/1994 |
| JP | 7-134811 | 5/1995 |
| JP | 07-134811 A * | 5/1995 |
| JP | 2000-311312 | 11/2000 |
| JP | 2000-311312 A * | 11/2000 |

* cited by examiner

*Primary Examiner* — Kevin Bernatz
(74) *Attorney, Agent, or Firm* — Oblon, Spivak, McClelland, Maier & Neustadt, L.L.P.

(57) ABSTRACT

The present invention relates to a wafer formed with an evaluation element and capable of improving productivity and a manufacturing method of an electronic component using the same. In a wafer according to the present invention, a plurality of elements connected to electrode films through lead-out conductive films are arranged and a chip area is defined for cutting out the plurality of elements in a given number. In the wafer, at least one evaluation element is formed in an area outside the chip area. The lead-out conductive films extend to the outside area and are connected to the evaluation elements. With this wafer, since the lead-out conductor is shared between the element and the evaluation element, the electrode film connected therewith can be shared, too. Accordingly, evaluation can be performed by using the evaluation element without the need of providing the wafer with a lead-out conductor and an electrode film exclusively for the evaluation element, so that the chip area to be cut out from the wafer can be made larger than before.

30 Claims, 8 Drawing Sheets

WAFER AND MANUFACTURING METHOD OF ELECTRONIC COMPONENT

TECHNICAL FIELD

The present invention relates to a wafer and a manufacturing method of an electronic component using the same.

BACKGROUND OF THE INVENTION

Recently, the importance of data backup for data erasure problem has increased with increase in volume of data to be stored in an information processing device such as a server. As a device for backing up large-volume data, there has been widely used a magnetic tape device exemplified by LTO (Liner Tape-Open). In the case of LTO, as much as 1.6 Tbytes data can be recorded on a half-inch width magnetic tape at a transmission rate of 120 Mbytes/sec or more.

The magnetic tape device is provided with a magnetic head for recording data on a magnetic tape or reading data recorded on the magnetic tape. The magnetic head is of a linear recording type, wherein since data is to be recorded and reproduced at each of a plurality of tracks defined along a longitudinal direction of the magnetic tape, a plurality of recording and reproducing elements corresponding to the individual tracks are arranged along a magnetic tape width direction. Typically, the magnetic head has recording and reproducing elements for 16 channels. In the production of the magnetic head, accordingly, even when only one element for one channel is malfunctioning, the entire device becomes a defective product, extremely lowering the yield.

In order to control the quality of reproducing elements formed on a wafer in the production of the magnetic head, a plurality of evaluation elements may be formed in a plurality of areas of the wafer. For example, the evaluation elements are formed by variously changing the MR height of the reproducing element from that of the product element and contribute to estimate of the quality of reproducing elements by measuring resistance characteristics for each MR height. As used herein, the MR height refers to a height of a reproducing element with reference to a tape bearing surface (TBS) to be brought into sliding contact with a magnetic tape and is an important factor in determining electrical characteristics of the reproducing element. A technology of forming such evaluation elements on a wafer is disclosed in Japanese Unexamined Patent Application Publication 7-134811, for example.

However, the evaluation elements formed on the wafer also require an area for disposing lead-out conductive films and electrode films in connection therewith, which extremely reduces an area for formation of the reproducing elements. Accordingly, although the quality can be effectively controlled by the evaluation elements, there arises a problem that the number of recording and reproducing elements that can be obtained from a single wafer will decrease. Considering the fact that the yield of a magnetic head is extremely low, as described above, this is a very serious problem in view of the productivity.

The above problem is inevitable as long as a plurality of elements and evaluation elements are formed on a common layer of a wafer and therefore is not peculiar to a wafer that is to be used for manufacturing a magnetic head but also occurs in a wafer that is to be used for manufacturing other electronic components such as an integrated circuit.

SUMMARY OF THE INVENTION

It is an object of the present invention to provide a wafer formed with an evaluation element and capable of improving productivity and a manufacturing method of an electronic component using the same.

1. Wafer

In order to solve the above problem, a wafer according to the present invention comprises a plurality of elements arranged and connected to electrode films through lead-out conductive films and has a chip area defined for cutting out the plurality of elements in a given number.

In the wafer, at least one evaluation element is formed in an area outside the chip area. The lead-out conductive films extend to the outside area and are connected to the evaluation element.

With this wafer, since the lead-out conductive film is shared between the element and the evaluation element, the electrode film connected therewith can be shared, too. Accordingly, evaluation can be performed by using the evaluation element without the need of providing the wafer with a lead-out conductive film and an electrode film exclusively for the evaluation element, so that the chip area to be cut out from the wafer can be made larger than before.

This increases the number of electronic components that can be obtained from a single wafer, thereby improving the productivity.

2. Manufacturing Method of Magnetic Head

A manufacturing method of an electronic component according to the present invention uses the above wafer including a plurality of elements arranged and connected to electrode films through lead-out conductive films and having a chip area defined for cutting out the plurality of elements in a given number.

In the wafer, at least one evaluation element is formed in an area outside the chip area. In addition, the lead-out conductive films extend to the outside area and are connected to the evaluation element.

The manufacturing method comprises a step of cutting out the chip area from the wafer.

With the electronic component manufacturing method according to the present invention, an electronic component can be obtained by using the above wafer, so that it is obvious that the same effect as above can be obtained.

The other objects, constructions and advantages of the present invention will be further detailed below with reference to the attached drawings. However, the attached drawings show only illustrative examples.

DESCRIPTION OF THE PREFERRED EMBODIMENTS

Figure 1:
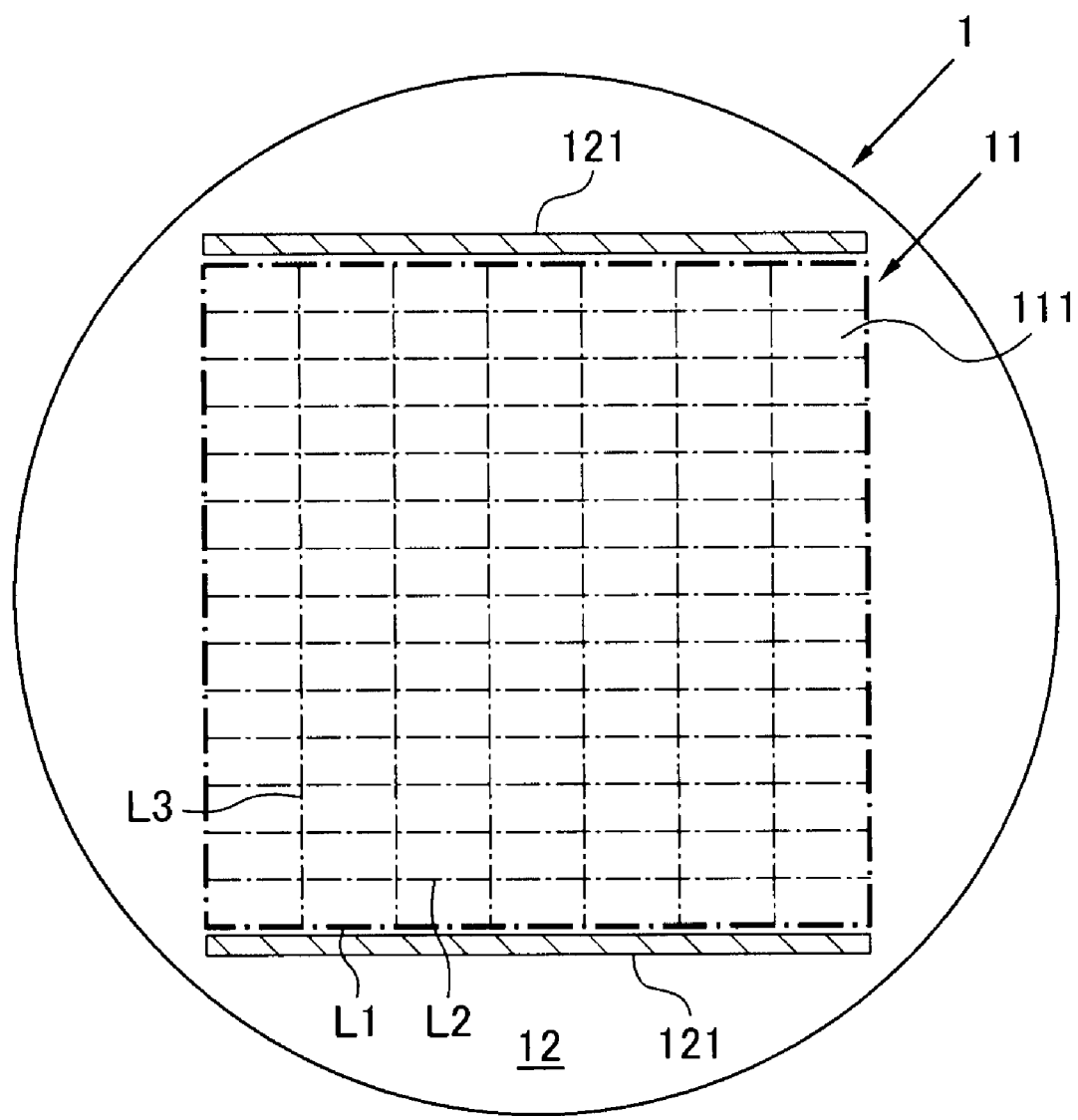
FIG. 1 is a plan view of a wafer according to the present invention.

FIG. 1 is a plan view of a wafer according to the present invention. On the surface of a wafer 1, there are defined a square chip area 11 for cutting out a plurality of elements in a given number and an outside area 12. The chip area 11 is defined by a boundary L1 with the outside area 12, and dicing lines L2, L3 are set vertically and horizontally within the area. The individual areas divided by the dicing lines L2, L3 serve as a chip 111 which includes a given number of elements and is to be used for manufacturing an electronic component.

Evaluation areas 121, in which evaluation elements are to be formed as a characteristic feature of the present invention, are formed in the outside area 12 in the vicinity of a pair of opposed sides of the boundary L1 along a longitudinal direction of the chip 111.

Figure 2:
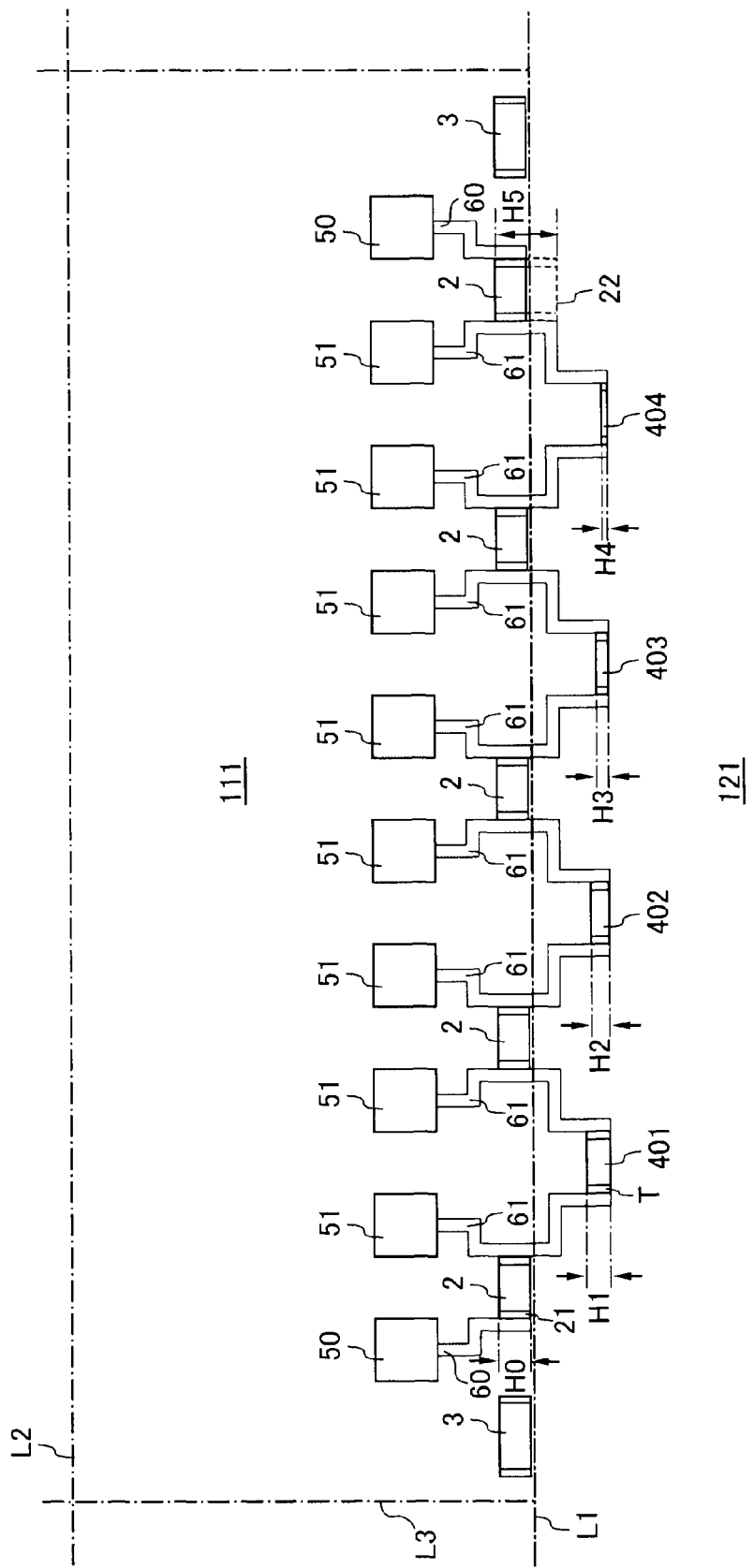
FIG. 2 is a plan view of a pattern of the wafer.

FIG. 2 is a plan view showing a pattern of the wafer 1. In the wafer 1, a plurality of elements 2 connected to electrode films 50, 51 through lead-out conductive films 60, 61 are arranged and each chip 111 includes a given number of elements 2.

The plurality of elements 2 are arranged at regular intervals along the boundary L1 between the chip area 11 and the outside area 12. Each of the plurality of elements 2 is of a rectangular shape and has a pair of opposed first terminals 21 along the boundary L1.

The lead-out conductive films 60, 61 and the electrode films 50, 51 are formed for each first terminal 21, and the first terminals 21 are connected to the electrode films 50, 51 through the lead-out conductive films 60, 61. Thus, each element 2 can be made electrically continuous through the pair of electrode films 50, 51 and the pair of lead-out conductive films 60, 61.

The electrode films 50, 51 are of a square shape and arranged at regular intervals along the boundary L1. On the other hand, the lead-out conductive films 60, 61 are formed such that they are crookedly led from the electrode films 50, 51 to the first terminals 21 disposed at both sides of the element 2. The electrode films 50, 51 and the lead-out conductive films 60, 61 are formed by sputtering a metal such as aluminum.

A typical example of the wafer 1 having such a pattern is a magnetic head to be used for a tape device. In this case, the chip area 11 is used for manufacturing a magnetic head. In addition, each of the plurality of elements 2 is a magnetoresistive effect element and formed in such a manner as to be partially exposed on a section, which will serve as a tape bearing surface, when the chip area 11 is cut out along the boundary L1. Moreover, servo elements 3 are formed at both ends of an array of the plurality of elements 2 in the chip 111.

The feature of the wafer 1 according to the present invention resides in the following pattern of the evaluation area 121.

The wafer 1 has a plurality of evaluation elements 401 to 404 formed in the area 12 outside the chip area 11. The evaluation elements 40 to 43 are of a rectangular shape and arranged at regular intervals along the boundary L1 in the evaluation area 121. The lead-out conductive films 61 extend to the outside area 12 and are connected to the evaluation elements 401 to 404.

The evaluation elements 401 to 404 have a pair of opposed second terminals T disposed along the boundary L1. In addition, the lead-out conductive films 61 are formed such that they are crookedly led from the first terminals 21 to the second terminals T disposed at both sides of each of the evaluation elements 401 to 404.

The pair of second terminals T are connected through the lead-out conductive films 61 to different ones of first terminals 21 that are disposed at two different elements 2 of the plurality of elements 2. More specifically, the pair of second terminals T are connected to each of two adjacent first terminals 21 of the first terminals 21 that are disposed at two adjacent elements 2. With such a connection, the length of the lead-out conductive film 61 can be minimized.

Thus, since each of the evaluation elements 401 to 404 can be made electrically continuous through the pair of electrode films 51 and the pair of conductive films 61, the characteristic evaluation using each of the evaluation elements 401 to 404 can be performed by bringing terminals of a measuring device into contact with the electrode films 51. At this time, since the electrode films 51 of each pair, which are connected to one of the evaluation elements 401 to 404, are connected to different ones of two elements 2, when power is applied to the evaluation elements 401 to 404 through the pair of electrode films 51, the passage of electric current through the element 2 will never happen to affect the evaluation.

In the case where the plurality of elements 2 are magnetoresistive effect elements, for example, the evaluation elements 401 to 404 are used to evaluate resistance characteristics for each dimension in a direction perpendicular to a section taken along the boundary L1, i.e., for each MR height, as described above. Accordingly, the evaluation elements 401 to 404 have different MR heights H1 to H4 from each other.

Figure 3:
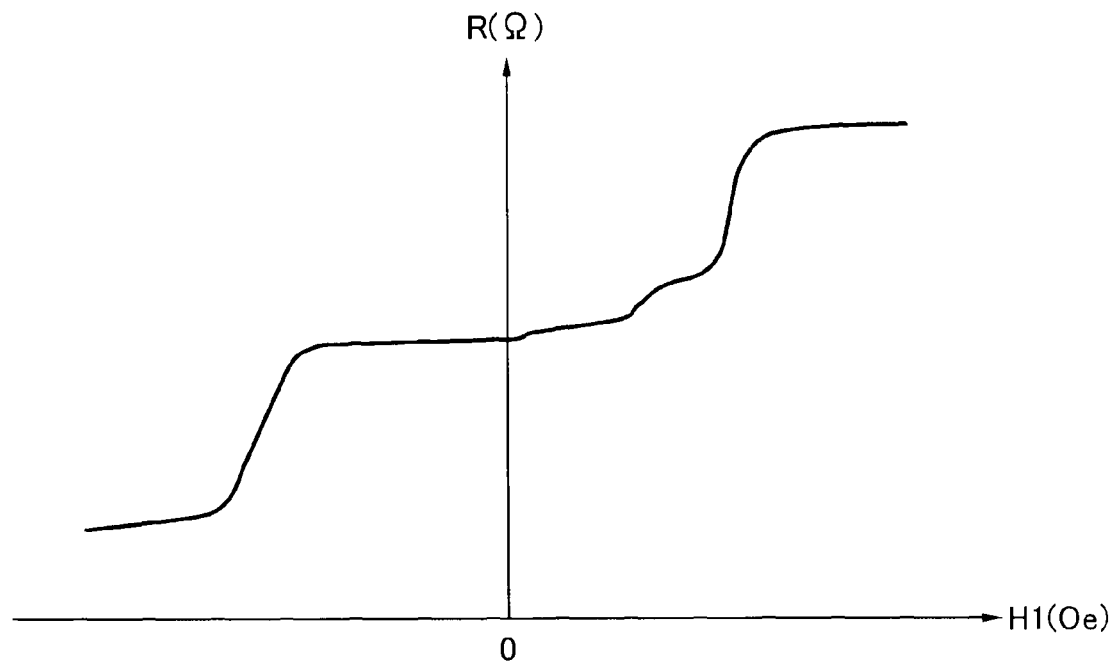
FIG. 3 is a graph of resistance characteristics.

The evaluation of resistance characteristics is performed by changing the strength of an applied magnetic field while applying a constant electric current from a measuring device to the evaluation elements 401 to 404 through the pair of electrode films 51. With this, the change of a resistance R ($\Omega$) with respect to the change of a magnetic field strength H1 (Oe) can be plotted for each of the evaluation elements 401 to 404 as a graph of resistance characteristics, as shown in FIG. 3.

Figure 4:
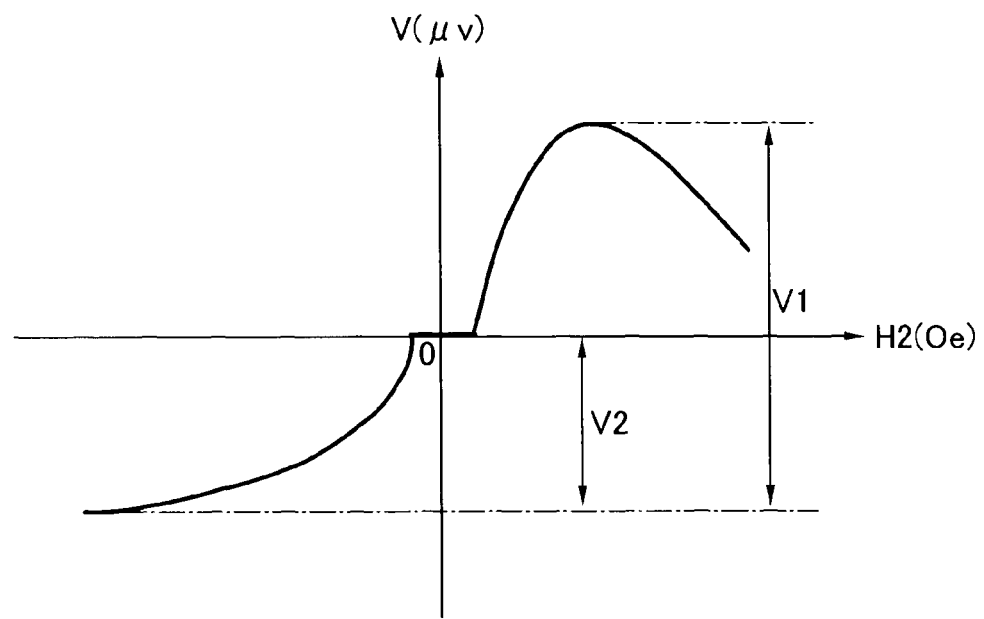
FIG. 4 is a graph showing change of an interterminal voltage V ($\mu v$) of evaluation elements with respect to an applied magnetic field strength H2 (Oe)

With this graph, moreover, it is also possible to perform evaluation of a bias point, i.e., an operating point of a magnetic head. FIG. 4 is a graph based on the graph of FIG. 3, showing the change of an interterminal voltage V ($\mu$v) of the evaluation elements 401 to 404 with respect to an bias magnetic field strength H2 (Oe). It should be noted that the bias point can be calculated by (V2/V1)*100(%) using a positive to negative peak-to-peak voltage V1 ($\mu$v) and a negative peak voltage V2 ($\mu$v). With a bias magnetic field whose strength corresponds to the bias point being applied to the evaluation elements 401 to 404, the magnetic head can be operated within a range showing ideal linear characteristics of the resistance characteristics.

In the present embodiment, the MR heights H1 to H4 are set smaller than an MR height H0 of the plurality of elements 2. This is because evaluation for an MR height H5, which is larger than the MR height H0, can be performed by forming an element 22 whose MR height reaches the outside area 12, as shown in FIG. 2. It should be noted that since a portion of the element 22 located within the outside area 12 can be removed when the chip area 11 is cut out, the MR height of the element 22 can be finally reduced to H0, not affecting the resulting chip 111.

In the present embodiment, moreover, the length of the lead-out conductive films 60, 61 from the plurality of elements 2 to the electrode films 50, 51 is different from the length of the lead-out conductive films 61 from the evaluation elements 401 to 404 to the electrode films 51. In view of accuracy of measurement, therefore, the resistance characteristics may be evaluated with at least one of the evaluation elements 401 to 404 set to the same MR height as the elements 2, thereby correcting a measurement error due to the difference in length.

At the manufacturing process of the magnetic head, accordingly, the resistance characteristics can be appropriately evaluated for each of the MR heights H1 to H4 in the evaluation area 121 of the wafer 1.

With this wafer 1, since the lead-out conductive film 61 are shared between the elements 2 and the evaluation elements 401 to 404, the electrode films 51 connected therewith can be shared, too. Accordingly, evaluation can be performed by using the evaluation elements 401 to 404 without the need of providing the wafer 1 with a lead-out conductive film and an electrode film exclusively for the evaluation element, so that the chip area 11 to be cut out from the wafer 1 can be made larger than before.

In the present embodiment, since the plurality of elements 2 and the plurality of evaluation elements 401 to 404, disposed across the boundary L1, are alternately arranged along the boundary L1, the surface of the wafer 1 can be efficiently exploited to effectively reduce the evaluation area 121.

This increases the number of electronic components that can be obtained from a single wafer 1, thereby improving the productivity.

In the foregoing embodiment, the evaluation elements 401 to 404 for evaluating the resistance characteristics are taken as an example, but embodiments of the present invention are not limited thereto. Plan views showing patterns of the wafer 1 according to other embodiments are shown in FIGS. 5 to 7 and will be described in order.

Figure 5:
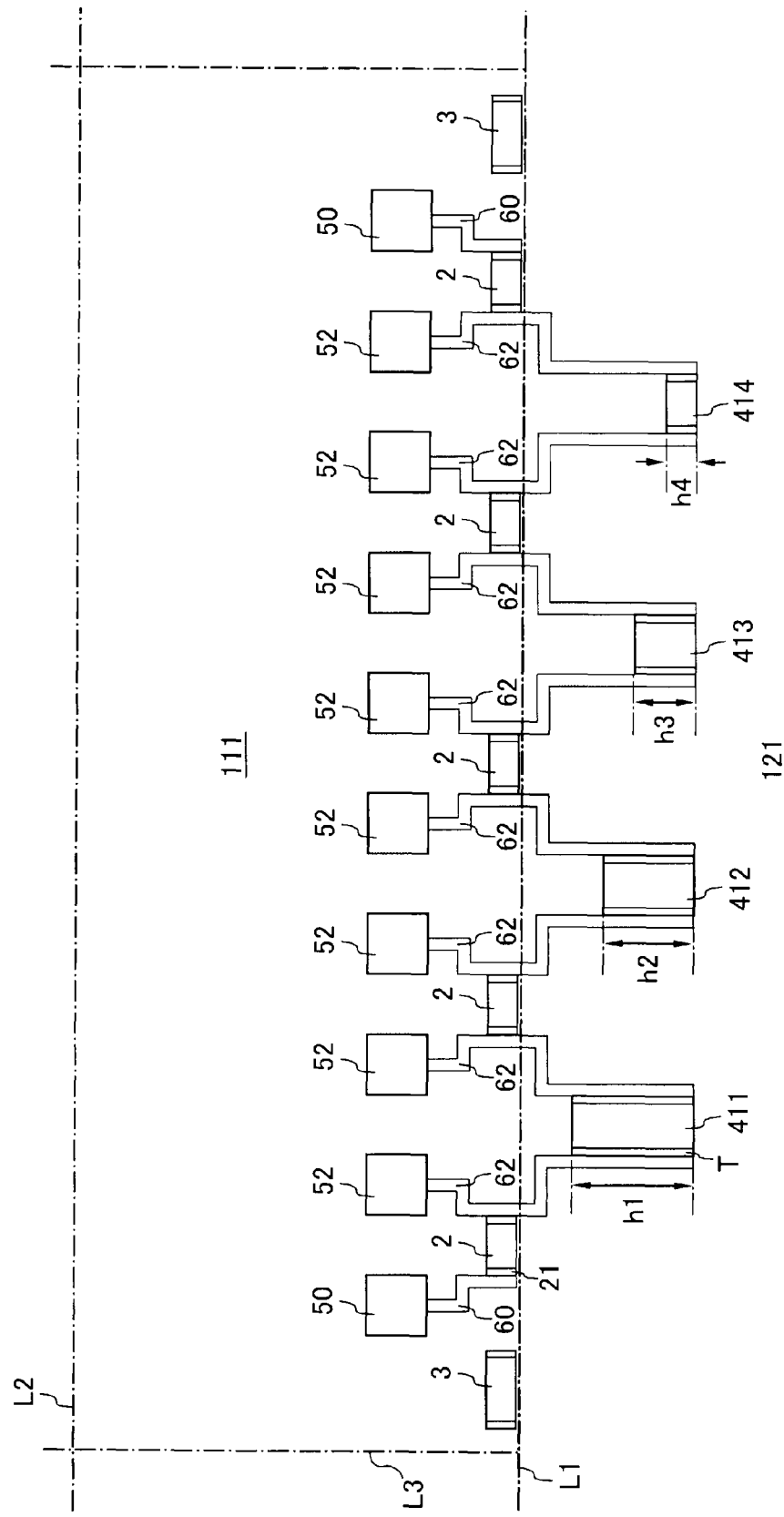
FIG. 5 is a plan view showing a pattern of a wafer according to another embodiment.

FIG. 5 shows an embodiment of evaluation elements for evaluating contact resistance with the lead-out conductive films. In this case, evaluation elements 411 to 414 have different contact areas with their lengths set to h1 to h4, respectively, at portions in contact with lead-out conductive films 62. Therefore, the change of a contact resistance with respect to the change of a contact area with the lead-out conductive film 62 can be measured by bringing terminals of a measuring device into contact with a pair of electrode films 52 and applying an electric current to the evaluation elements 411 to 414.

Figure 6:
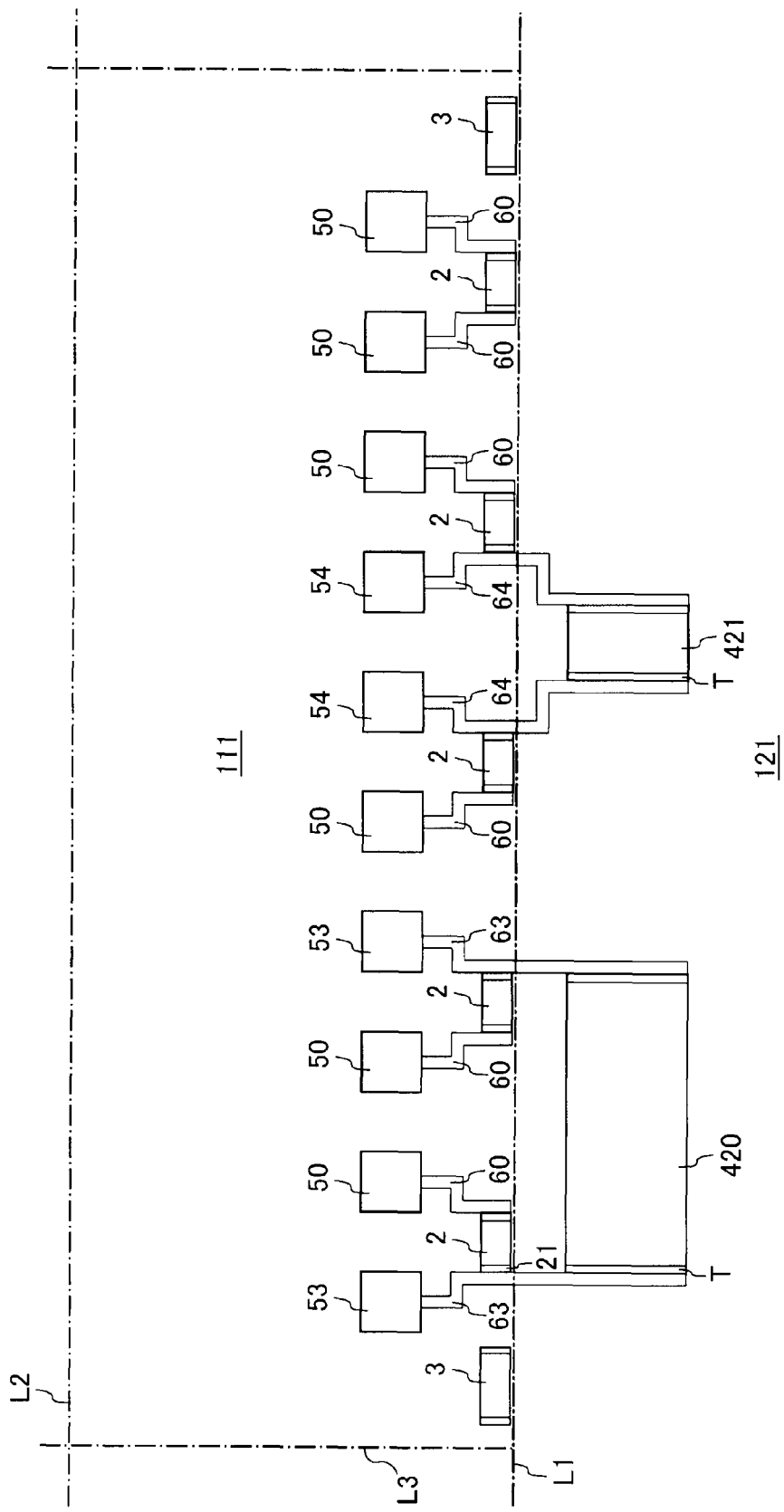
FIG. 6 is a plan view showing a pattern of a wafer according to another embodiment.
Figure 7:
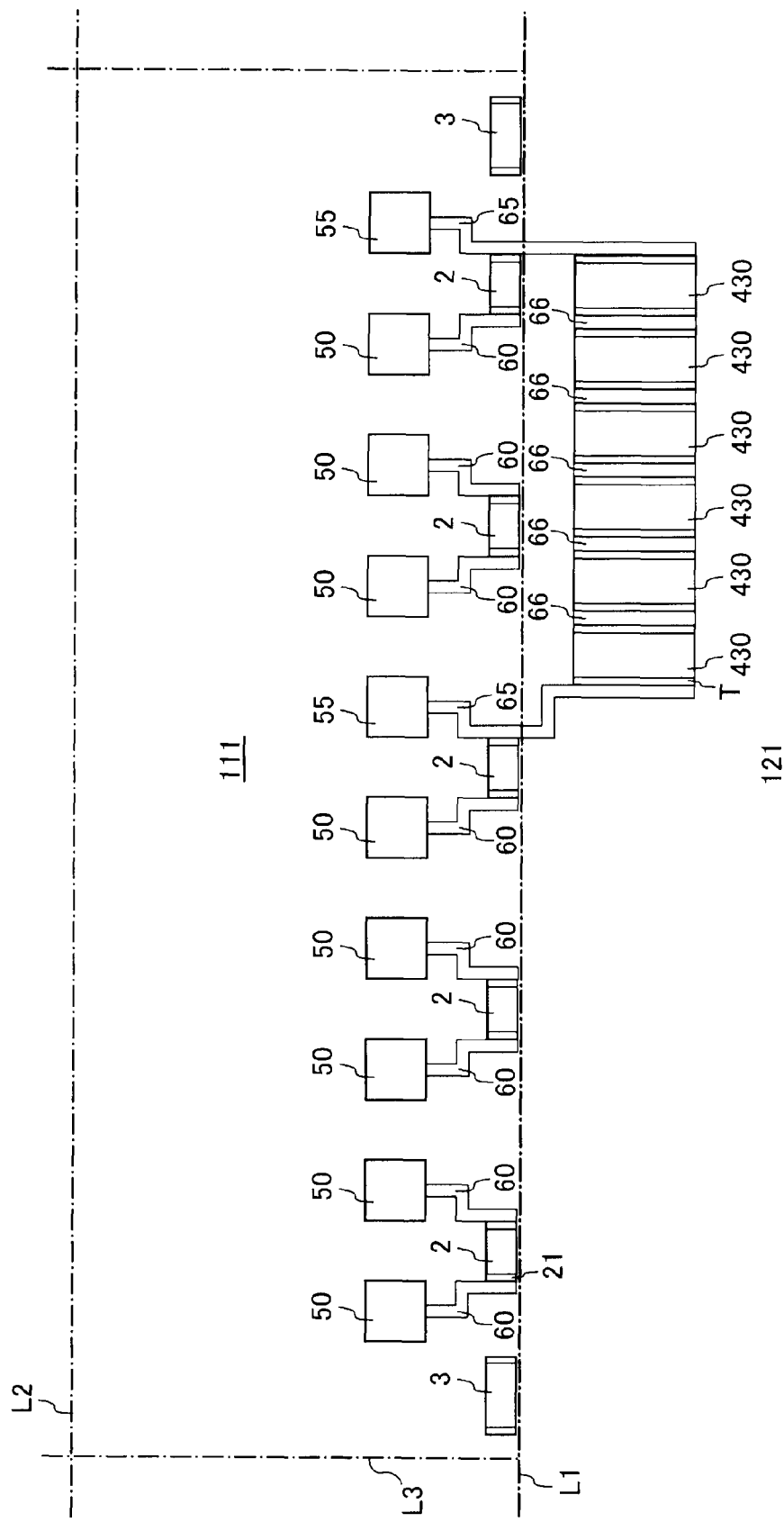
FIG. 7 is a plan view showing a pattern of a wafer according to another embodiment.

FIG. 6 shows an embodiment of evaluation elements for measuring sheet resistance. In this case, evaluation elements 420, 421 have different areas in the layer plane, and their areas are designated by S1, S2 (S1>S2). Also, resistances R1, R2 of the evaluation elements 420, 421 are measured through a pair of electrode films 53 and a pair of electrode films 54, respectively, as in the foregoing measurement.

It should be noted that since the difference between the areas S1, S2 of the evaluation elements 420, 421 corresponds to the difference between the resistances R1, R2, if the sheet resistance of the evaluation element 420 is designated by Rs, the following equation holds:

$$(S1-S2):S1=(R1-R2):Rs.$$

Thus, the sheet resistance Rs can be obtained from the equation. The sheet resistance of the evaluation element 421 can also be obtained in the same manner.

When measuring contact resistance of an element having a large contact area with a lead-out conductive film 63, like the evaluation element 420 in the present embodiment, there arises a problem that the contact resistance decreases to a level as low as a measurement error and therefore becomes unmeasurable.

According to an embodiment shown in FIG. 7, however, its measurement becomes possible. In the present embodiment, a plurality of evaluation elements 430 are connected together along the boundary L1 through conductive films 66, purposefully increasing the whole contact resistance enough for measurement. It should be noted that the conductive films 66 have the same quality as the other lead-out conductive films 60, 63, and the total area of the plurality of evaluation elements 430 in the layer plane is equal to the area of the evaluation element 420.

For measurement, the whole contact resistance is measured by bringing terminals of a measuring device into contact with a pair of electrode films 55 and applying an electric current to the plurality of evaluation elements 430. Then, the contact resistance of the evaluation element 420 can be measured by dividing the whole by the number of areas in contact with the conductive films 65, 66 (7 areas in the case of FIG. 7).

As described above, various evaluations can be performed during the manufacturing process by forming a given pattern in the evaluation area 121 of the wafer 1.

Next will be described a manufacturing method of an electronic component according to the present invention. The electronic component manufacturing method according to the present invention uses the above wafer 1, in which the plurality of elements 2 connected to the electrode films 50 to 56 through the lead-out conductive films 60 to 64 are arranged and the chip area 11 is defined for cutting out the plurality of elements 2 in a given number.

The wafer 1 has at least one of the evaluation elements 401 to 404, 411 to 414, 420, 421, 430 formed in the outside area 12 of the chip area 11. In addition, the lead-out conductive films 61 to 65 extend to the outside area 12 and are connected to the evaluation elements 401 to 404, 411 to 414, 420, 421, 430.

The manufacturing method includes a step of cutting out the chip area 11 from the wafer 1 and a step of dicing along the dicing lines L2, L3. Thus, the outside area 12 can be removed from the wafer 1 and the chip 111 can be finally obtained as an electronic component.

With the electronic component manufacturing method according to the present invention, an electronic component can be obtained by using the above wafer 1, so that it is obvious that the same effect as above can be obtained.

Next, the chip 111 thus obtained will be described with reference to an example of the application to a magnetic head.

Figure 8:
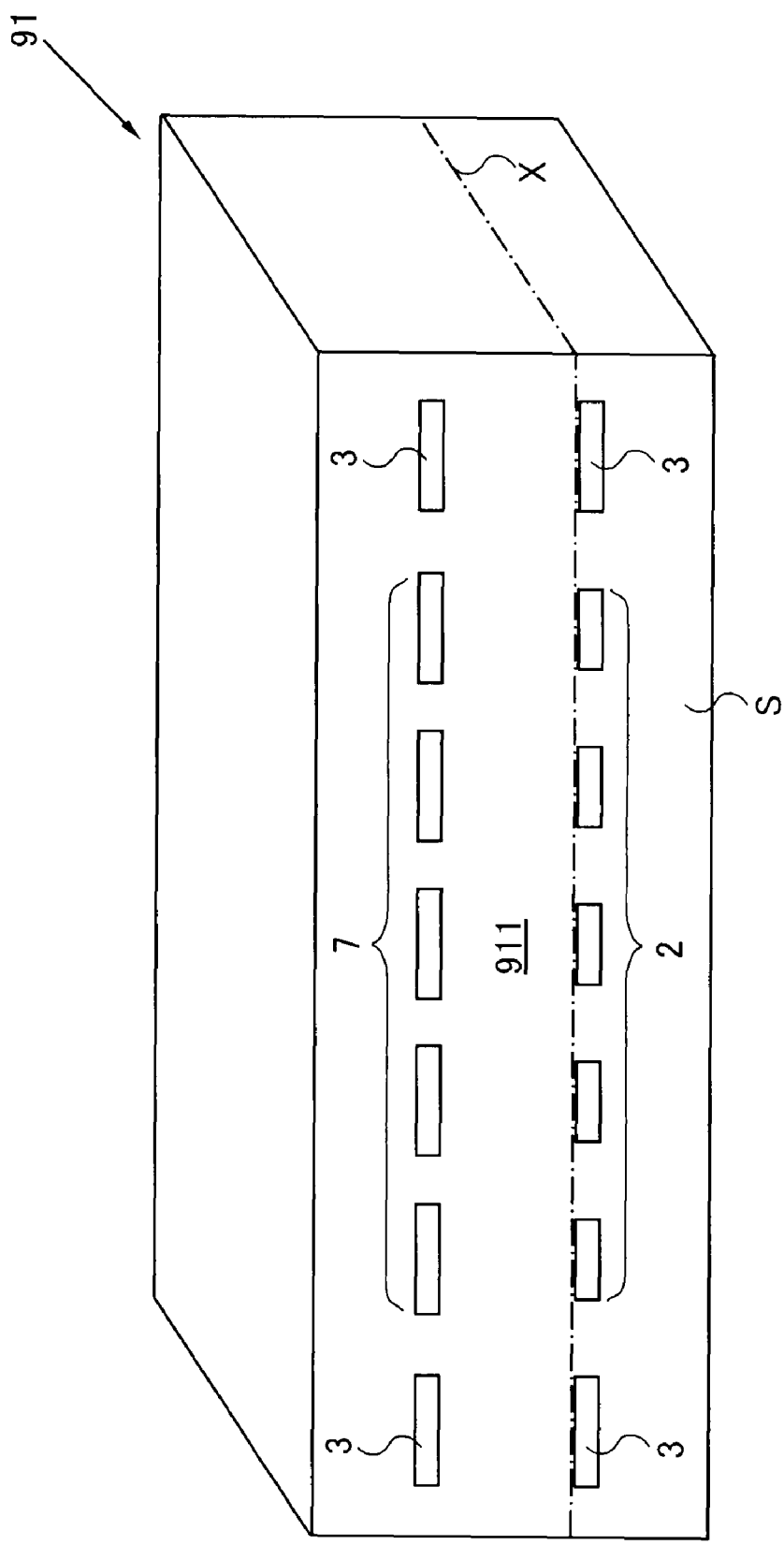
FIG. 8 is a perspective view of a magnetic head's substrate obtained from a wafer.

FIG. 8 is a perspective view of a magnetic head's substrate obtained from the wafer 1. A substrate 91 (i.e., the chip 111) has a rectangular prism shape, and reproducing elements 2 having TMR (tunnel magneto-resistance) effect or GMR (giant magneto-resistance) effect (i.e., magneto-resistive effect elements) and recording elements 7 being electromagnetic conversion elements are arranged and exposed on a section S along the boundary L1. Moreover, servo elements 3 are disposed and exposed at both ends of an array of the reproducing elements 2 and at both ends of an array of the recording elements 7. As described above, the section S is a tape bearing surface to be in sliding contact with a magnetic tape. It should be noted that the patterns shown in FIGS. 2, 5 to 7 illustrate a layer indicated by a symbol X in FIG. 3.

Figure 9:
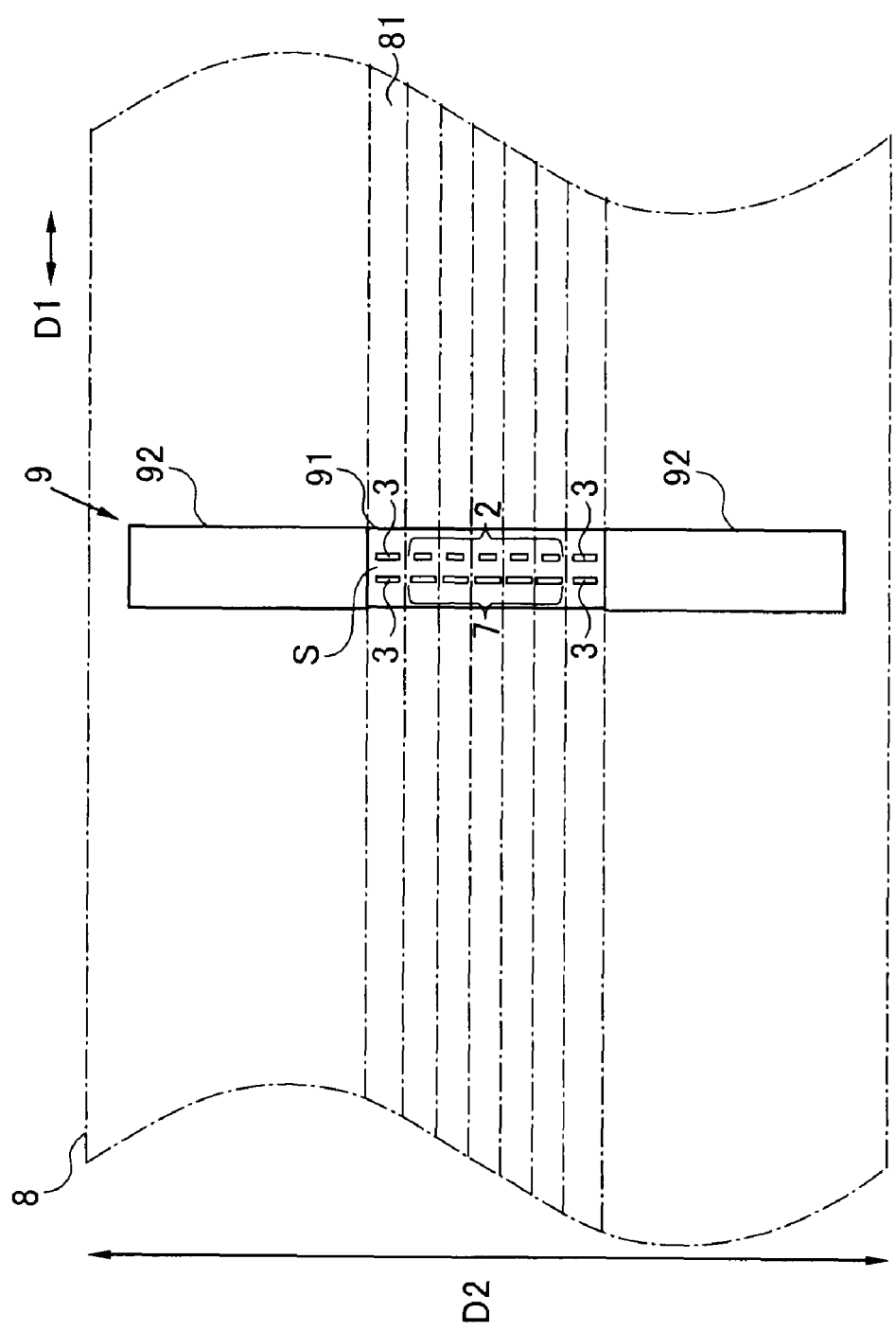
FIG. 9 is a plan view showing use of a magnetic head in a magnetic tape device as seen from a tape bearing surface side.

FIG. 9 is a plan view showing use of a magnetic head in a magnetic tape device as seen from the tape bearing surface side. A magnetic head 9 includes the substrate 91 and two auxiliary members 92 with the tape bearing surface S kept in sliding contact with a magnetic tape 8 running along a running direction D1. The two auxiliary members 92 have a rectangular prism shape and are joined to both end faces of the substrate 91 in a tape width direction D2.

The reproducing elements 2, the recording elements 7 and the servo elements 3 are arranged in accordance with a plurality of tracks 81 defined along the running direction D1 of the magnetic tape 8 to perform reading and writing of data for the corresponding tracks 81.

The recording element 7 performs writing of data by converting input electrical signals and applying a signal magnetic field to the magnetic tape 81. On the other hand, the reproducing element 2 performs reading of data by sensing a signal magnetic field from the magnetic tape 8 and converting it to electrical signals. Moreover, the servo element 3 reads out positional information recorded on the magnetic tape 8.

Although the magnetic head has been described hereinabove as a typical example of the application of the wafer 1 according to the present invention, it is obvious that various other applications are possible as long as a chip has a structure that a plurality of elements connected to terminal electrodes through lead-out conductors are arranged.

The present invention has been described in detail above with reference to preferred embodiments. However, obviously those skilled in the art could easily devise various modifications of the invention based on the technical concepts underlying the invention and teachings disclosed herein.

What is claimed is:

1. A wafer comprising:
   a chip area; and
   an outside area of said chip area, wherein
   said chip area includes a plurality of chips arranged therein,
   each of said plurality of chips includes one or more elements, electrode films, and lead-out conductive films,
   each of said one or more elements is connected to said electrode films through said lead-out conductive films within each of said plurality of chips,
   only said outside area includes at least one evaluation element, and
   said lead-out conductive films extend to said outside area and are connected to said at least one evaluation element
   said one or more elements and said electrode films are located in said chip area, without being located outside said chip area, and
   Said at least one evaluation element is electrically connected to one of said electrode films such that said at least one evaluation element is capable of providing evaluation characteristics via said one of said electrode films.

2. The wafer of claim 1, wherein said one or more elements are arranged along a boundary between said chip area and said outside area.

3. The wafer of claim 1, wherein said one or more elements are arranged at regular intervals.

4. The wafer of claim 1, wherein each of said or more elements has a pair of opposed first terminals,
   said lead-out conductive films and said electrode films are formed for each of said first terminals, and
   said first terminals are connected to said electrode films through said lead-out conductive films.

5. The wafer of claim 4, wherein said at least one evaluation element has a pair of opposed second terminals, and
   said pair of second terminals are connected through said lead-out conductive films to different ones of said first terminals that are disposed at two different elements of said one or more elements.

6. The wafer of claim 5, wherein said two different elements are disposed adjacent to each other.

7. The wafer of claim 6, wherein said pair of second terminals are connected to each of two said first terminals that are disposed adjacent to each other.

8. The wafer of claim 1, wherein a plurality of said at least one evaluation element is arranged along a boundary between said chip area and said outside area.

9. The wafer of claim 8, wherein said plurality of said at least one evaluation element is arranged at regular intervals.

10. The wafer of claim 1, wherein said chip area is to be used for manufacturing a magnetic head, and
    each of said one or more elements is a magneto-resistive effect element and formed in such a manner as to be partially exposed on a section when said chip area is cut out.

11. The wafer of claim 10, wherein dimensions of a plurality of said at least one evaluation element in a direction perpendicular to said section are different from each other.

12. The wafer of claim 10, wherein said at least one evaluation element has smaller dimensions than said one or more elements in a direction perpendicular to said section.

13. The wafer of claim 1, wherein contact areas of a plurality of said at least one evaluation element with said lead-out conductive films are different from each other.

14. The wafer of claim 1, wherein areas of a plurality of said at least one evaluation element in a layer plane are different from each other.

15. The wafer of claim 1, wherein at least some of a plurality of said at least one evaluation element are connected to each other through a conductive film.

16. A manufacturing method of an electronic component using a wafer having a chip area and an outside area of said chip area, wherein
    said chip area includes a plurality of chips arranged therein,
    each of said plurality of chips includes one or more elements, electrode films, and lead-out conductive films,
    each of said one or more elements is connected to said electrode films through said lead-out conductive films within each of said plurality of chips,
    only said outside area includes at least one evaluation element,
    said lead-out conductive films extend to said outside area and are connected to said at least one evaluation element
    said one or more elements and said electrode films are located in said chip area, without being located outside said chip area,
    the method comprising the steps of:
    evaluating characteristics of said at least one evaluation element via said electrode films;
    cutting out said chip area from said wafer to remove said outside area; and
    dicing said chip area to obtain each of said plurality of chips as an electronic component.

17. The electronic component manufacturing method of claim 16, wherein said one or more elements are arranged along a boundary between said chip area and said outside area.

18. The electronic component manufacturing method of claim 16, wherein said one or more elements are arranged at regular intervals.

19. The electronic component manufacturing method of claim 16, wherein each of said one or more elements has a pair of opposed first terminals, and
    said first terminals are connected to said electrode films through said lead-out conductive films.

20. The electronic component manufacturing method of claim 19, wherein said at least one evaluation element has a pair of opposed second terminals, and said pair of second terminals are connected through said lead-out conductive films to different ones of said first terminals that are disposed at two different elements of said one or more elements.

21. The electronic component manufacturing method of claim 20, wherein said two different elements are disposed adjacent to each other.

22. The electronic component manufacturing method of claim 21, wherein said pair of second terminals are connected to each of two said first terminals that are disposed adjacent to each other.

23. The electronic component manufacturing method of claim 16, wherein a plurality of said at least one evaluation element is arranged along a boundary between said chip area and said outside area.

24. The electronic component manufacturing method of claim 23, wherein said plurality of said at least one evaluation element is arranged at regular intervals.

25. The electronic component manufacturing method of claim 16, wherein said chip area is to be used for manufacturing a magnetic head, and
each of said one or more elements is a magneto-resistive effect element and formed in such a manner as to be partially exposed on a section when said chip area is cut out.

26. The electronic component manufacturing method of claim 25, wherein dimensions of a plurality of said at least one evaluation element in a direction perpendicular to said section are different from each other.

27. The electronic component manufacturing method of claim 25, wherein said at least one evaluation element has smaller dimensions than said one or more elements in a direction perpendicular to said section.

28. The electronic component manufacturing method of claim 16, wherein contact areas of a plurality of said at least one evaluation element with said lead-out conductive films are different from each other.

29. The electronic component manufacturing method of claim 16, wherein areas of a plurality of said at least one evaluation element in a layer plane are different from each other.

30. The electronic component manufacturing method of claim 16, wherein at least some of a plurality of said at least one evaluation element are connected to each other through a conductive film.

* * * * *